United States Patent
Jeon et al.

(10) Patent No.: US 9,557,637 B2
(45) Date of Patent: Jan. 31, 2017

(54) METHOD OF DESIGNING PATTERNS OF SEMICONDUCTOR DEVICES IN CONSIDERATION OF PATTERN DENSITY

(71) Applicant: SAMSUNG ELECTRONICS CO., LTD., Suwon-si, Gyeonggi-do (KR)

(72) Inventors: Joong-Won Jeon, Seoul (KR); Ji-Youn Song, Seoul (KR); Mun-Su Shin, Hwaseong-si (KR); Seong-Yul Park, Hwaseong-si (KR); Suk-Joo Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 50 days.

(21) Appl. No.: 14/449,377

(22) Filed: Aug. 1, 2014

(65) Prior Publication Data

US 2015/0143312 A1    May 21, 2015

(30) Foreign Application Priority Data

Nov. 19, 2013  (KR) .......................... 10-2013-0140654

(51) Int. Cl.
G06F 17/50 (2006.01)
G03F 1/36 (2012.01)
G03F 1/70 (2012.01)
G03F 7/20 (2006.01)

(52) U.S. Cl.
CPC . G03F 1/36 (2013.01); G03F 1/70 (2013.01); G03F 7/70433 (2013.01)

(58) Field of Classification Search
CPC ....................................................... G03F 1/144
USPC .......................................................... 716/54
See application file for complete search history.

(56) References Cited

U.S. PATENT DOCUMENTS

| | | | |
|---|---|---|---|
| 6,396,123 B1 | 5/2002 | Nagaoka | |
| 6,504,192 B2 | 1/2003 | Hasunuma | |
| 7,456,446 B2 | 11/2008 | Tahira et al. | |
| 7,671,469 B2 | 3/2010 | Lee et al. | |
| 7,971,158 B2 | 6/2011 | Anderson et al. | |
| 2004/0213029 A1 | 10/2004 | Hirata et al. | |
| 2005/0116268 A1 | 6/2005 | Tahira et al. | |
| 2007/0098247 A1* | 5/2007 | Sanderson | G06F 17/5081 382/145 |
| 2007/0174802 A1* | 7/2007 | Shin | G03F 1/36 716/124 |
| 2010/0006896 A1 | 1/2010 | Uemura | |
| 2010/0044755 A1 | 2/2010 | Tsuda et al. | |
| 2011/0057685 A1 | 3/2011 | Noguchi | |
| 2011/0101433 A1 | 5/2011 | Kim | |
| 2013/0320405 A1 | 12/2013 | Jeon et al. | |

FOREIGN PATENT DOCUMENTS

KR    10-2004-0008504 A    1/2004
KR    10-2006-0009419 A    1/2006

(Continued)

*Primary Examiner* — Suresh Memula
(74) *Attorney, Agent, or Firm* — Lee & Morse P.C.

(57) ABSTRACT

A method of designing patterns of semiconductor devices includes forming a plurality of tiles having patterns on a wafer, measuring the patterns of the plurality of tiles, analyzing the measurements of the patterns and determining a tile having such a size that the measurements linearly vary according to a design size and pattern density, and modifying the pattern density of the determined tile.

17 Claims, 10 Drawing Sheets

(56) References Cited

FOREIGN PATENT DOCUMENTS

| KR | 10-2007-0078566 A | 8/2007 |
| KR | 10-2008-0062727 A | 7/2008 |
| KR | 10-2010-0025684 A | 3/2010 |
| KR | 10-2013-0136329 A | 12/2013 |

* cited by examiner

METHOD OF DESIGNING PATTERNS OF SEMICONDUCTOR DEVICES IN CONSIDERATION OF PATTERN DENSITY

CROSS-REFERENCE TO RELATED APPLICATION

Korean Patent Application No. 10-2013-0140654, filed on Nov. 19, 2013, in the Korean Intellectual Property Office, and entitled: "Method Of Designing Patterns Of Semiconductor Devices," is incorporated by reference herein in its entirety.

BACKGROUND

1. Field

Embodiments relate to a method of designing patterns of semiconductor devices in consideration of a pattern density and/or perimeter.

2. Description of Related Art

With an increase in the integration density of semiconductor devices, the influence of a pattern density and perimeter upon a process of processing a semiconductor device has gradually increased. For example, even if the same process is performed, patterns having the same design may be formed to have different shapes and sizes in a region having a high pattern density as compared to a region having a low pattern density. To obtain appropriate performance of the semiconductor device, patterns should have similar shapes and sizes if possible. Accordingly, it is necessary to minimize the influence of the pattern density and perimeter to improve the uniformity and precision of patterns due to the same process of processing semiconductor devices.

SUMMARY

Embodiments provide a method of modifying a pattern density of a semiconductor device in consideration of a pattern density and/or perimeter.

Embodiments also provide a method of extracting an effective tile array in a process of processing a semiconductor device.

Embodiments also provide a method of modifying a pattern density and perimeter of a semiconductor device.

Embodiments also provide a method of modifying patterns of semiconductor devices.

Embodiments also provide electronic systems using semiconductor devices with modified pattern densities.

In accordance with an aspect of embodiments, a method of designing patterns of semiconductor devices includes forming a plurality of tiles having patterns on a wafer, measuring the patterns of the plurality of tiles, analyzing the measurements of the patterns and determining a tile having such a size that the measurements linearly vary according to a design size and pattern density, and modifying the pattern density of the determined tile.

Forming the plurality of tiles may include forming tiles having a same area and tiles having a same pattern density.

Forming the tiles having the same area may include forming tiles having the same area and different pattern densities.

Forming the tiles having the same area may include forming the tiles with the same area in a same row.

Forming the tiles having the same pattern density may include forming tiles having the same pattern density and different areas.

Forming the tiles having the same pattern density may include forming the tiles with the same pattern density in a same column.

Forming the plurality of tiles may include arranging the tiles as islands in a plurality of rows and a plurality of columns.

Analyzing the measurements of the patterns may include setting the design size on an X axis of a graph, setting the pattern density on a Y axis of the graph, and plotting the measurements for each area of the tiles.

The patterns may include an upper electrode pattern of a decoupling capacitor, and modifying the pattern density may include modifying a layout of the upper electrode pattern of the decoupling capacitor.

Modifying the layout of the upper electrode pattern of the decoupling capacitor may include unifying at least two upper electrode patterns in an X-axis direction.

Modifying the layout of the upper electrode pattern of the decoupling capacitor may include unifying at least two upper electrode patterns in a Y-axis direction.

Modifying the layout of the upper electrode pattern of the decoupling capacitor may include connecting at least two upper electrode patterns using a bridge.

Modifying the layout of the upper electrode pattern of the decoupling capacitor may include modifying a box-type pattern into a line-type pattern, a bar-type pattern, and/or a rim-type pattern.

In accordance with another aspect of embodiments, a method of designing patterns includes generating a test pattern block having an imaginary pattern layout, forming the imaginary pattern layout of the test pattern block in a real pattern on a wafer, measuring the real pattern and determining an effective tile array capable of affecting uniformity of the real pattern, and modifying the imaginary pattern layout such that a pattern density of the effective tile array falls within a reference density range.

Generating the test pattern block may include forming a plurality of tiles having different areas and/or pattern densities, and determining the effective tile array may include determining an area of a tile showing a relatively linear relationship between a size of the real pattern and the pattern density.

In accordance with another aspect of embodiments, a method of designing patterns of semiconductor devices includes forming a plurality of tiles having patterns on a wafer, such that the patterns are within predetermined ranges of design size and pattern density, measuring dimensions of the patterns of the plurality of tiles, analyzing the measurements of the patterns, such that a tile having patterns that linearly vary a pattern density according to a design size is determined, and modifying the pattern density of the determined tile.

The method may further include establishing a pattern density range of the determined tile, the pattern density range corresponding to the linear variation of the measured patterns.

Modifying the pattern density of the determined tile may include modifying the pattern density of the patterns, such that the modified pattern density is within the established pattern density.

Modifying the pattern density of the determined tile may include modifying a layout of the patterns.

The patterns may include an upper electrode pattern of a decoupling capacitor, and modifying the pattern density may include modifying the layout of the upper electrode pattern of the decoupling capacitor.

BRIEF DESCRIPTION OF THE DRAWINGS

The foregoing and other features and advantages of embodiments will be apparent from the more particular descriptions, as illustrated in the accompanying drawings in which like reference characters refer to the same parts throughout the different views. The drawings are not necessarily to scale, emphasis instead being placed upon illustrating the principles of the embodiments. In the drawings.

DETAILED DESCRIPTION

Figure 1A:
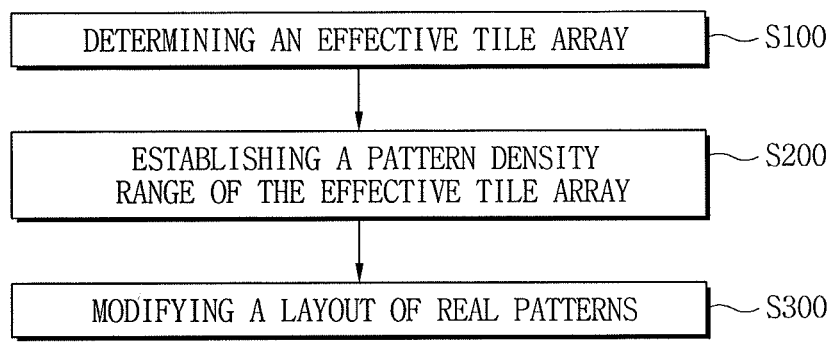
FIG. 1A illustrates a flowchart of a method of designing patterns of semiconductor devices according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein to describe embodiments is not intended to limit. The articles "a," "an," and "the" are singular in that they have a single referent, however the use of the singular form in the present document should not preclude the presence of more than one referent. In other words, elements of embodiments referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to limit to the precise shape of a region of a device.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

Hereinafter, construction of a memory device and a method of fabricating the memory device according to embodiments will be described with reference to the appended drawings.

Figure 1B:
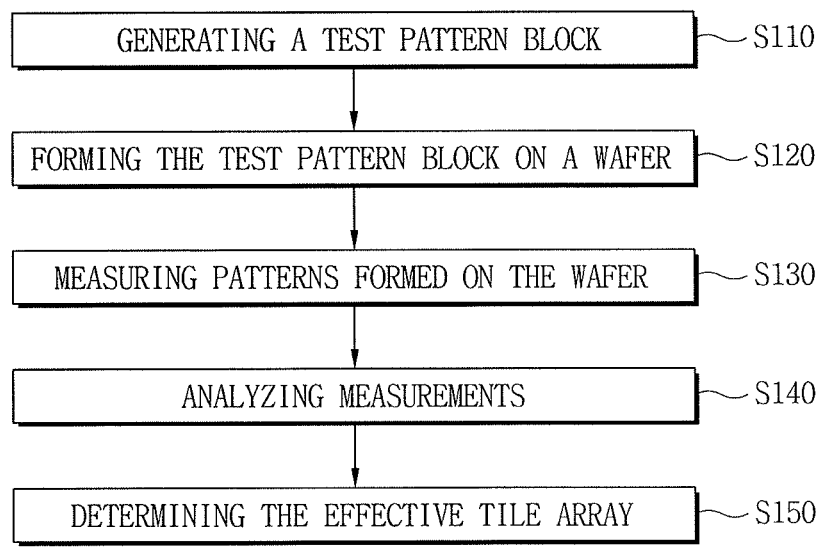
FIG. 1B illustrates a flowchart of a method of determining an effective tile array according to embodiments.
Figure 2A:
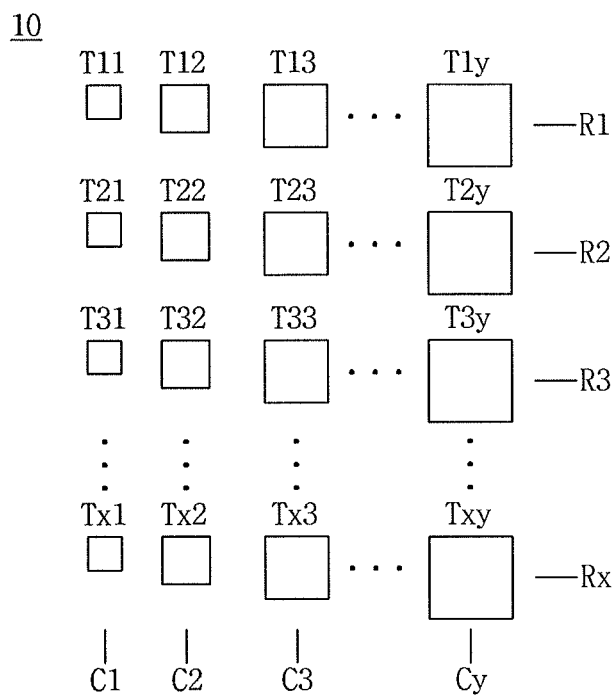
FIGS. 2A and 2B illustrate conceptual diagrams of stages in the method of determining the effective tile array according to embodiments.
Figure 2B:
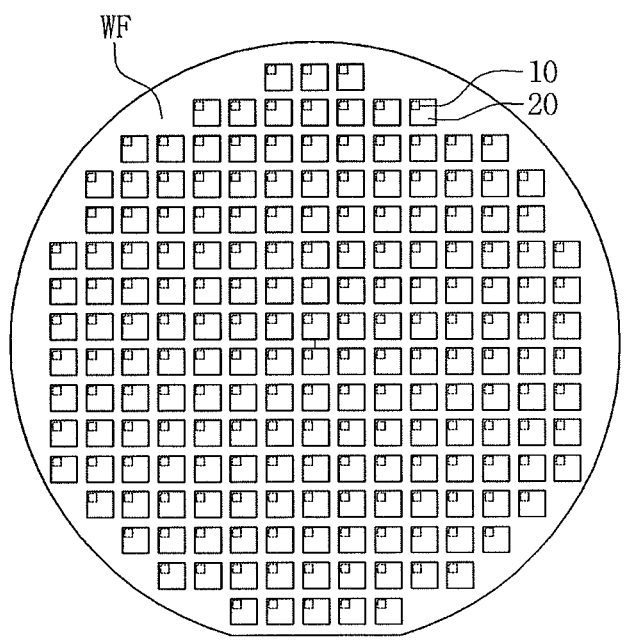

FIGS. 1A and 1B illustrate flowcharts of a method of designing patterns of semiconductor devices according to embodiments. FIGS. 2A and 2B illustrate conceptual diagrams of stages in a method of designing patterns of semiconductor devices according to embodiments.

Referring to FIG. 1A, a method of designing a pattern of the semiconductor device according to embodiments may include determining an effective tile array (S100), establishing a pattern density range of the effective tile array (S200), and modifying a real pattern layout using a computer to have a pattern density within a pattern density range per the effective tile array (S300). Thereafter, the modified real pattern layout may be formed on a semiconductor substrate (e.g., a wafer) to fabricate the semiconductor device.

FIG. 1B illustrates a flowchart of a method of determining the effective tile array according to embodiments, i.e., sub-operations within operation S100 of FIG. 1A. FIGS. 2A-4 illustrate conceptual diagrams of the sub-operation within operation S100 of FIG. 1A.

Referring to FIGS. 1B and 2A, the method of determining the effective tile array may include generating a test pattern block 10 using a computer (S110). The test pattern block 10 may include a plurality of tiles Txy, e.g., T11, T12, T13, . . . T1y, T21, T22, T23, T2y, T31, T32, T33, T3y, . . . Tx1, Tx2, Tx3, . . . etc. The plurality of tiles Txy may be arranged in a matrix pattern, e.g., as latticed islands in a plurality of rows Rx and a plurality of columns Cy. Here, x and y may be arbitrarily determined, e.g., according to designer's or operator's intentions. The test pattern block 10 and/or the plurality of tiles Txy may include a conceptual and/or imaginary pattern layout viewed on a database of a design program, on a computer monitor, and/or a photomask.

For example, the plurality of tiles Txy arranged in same rows Rx may have a same pattern density Dx. For example, tiles T11 through T1y arranged in a first row R1 may have a first pattern density D1, tiles T21 through T2y arranged in a second row R2 may have a second pattern density D2 that is different from the first pattern density D1, tiles T31 through T3y arranged in a third row R3 may have a third pattern density D3 that is different from the first pattern density D1 and the second pattern density D2, etc. Tiles Txy arranged in each of the remaining rows Rx may have a same and unique pattern density Dx. For example, pattern densities Dx of the respective tiles Txy may be variously split between a minimum pattern density Dmin and a maximum pattern density Dmax, which are obtained according to design rules. For example, the first row R1 may have a first pattern density D1 of about 10%, the second row R2 may have a second pattern density D2 of about 20%, the third row R3 may have a third pattern density D3 of about 30%, and an x-th pattern density Dx of the x-th row Rx may have a corresponding arbitrary density. The minimum pattern density Dmin and the maximum pattern density Dmax may be arbitrarily determined (e.g., about 10% and 80%) according to the design rules or processes of processing semiconductor devices.

The plurality of tiles Txy arranged in a same column Cy may have a same area Sy. For example, tiles T11 through Tx1 arranged in a first column C1 may have a first area S1, tiles T12 through Tx2 arranged in a second column C2 may have a second area S2, tiles T13 through Tx3 arranged in a third column C3 may have a third area S3, etc. Tiles Txy disposed in each of the remaining columns Cy may have a same area Sy. For example, the areas Sy of the respective tiles Txy may be variously split between a minimum area Smin and a maximum area Smax, which are obtained according to design rules or process rules. The minimum area Smin and the maximum area Smax may be arbitrarily determined according to the design rules, pattern density rules, or processes of processing various semiconductor devices. For example, tiles T11 through Tx1 arranged in the first column C1 may have an area of about 25 $\mu m^2$, tiles T12 through Tx2 arranged in the second column C2 may have an area of about 50 $\mu m^2$, tiles T13 through Tx3 arranged in the third column Tx3 may have an area of about 75 $\mu m^2$, and tiles Txy arranged in a y-th column may have the same determined area.

Each of the tiles Txy may have a same layout as or a similar layout as a real pattern. For example, each of the tiles Txy may have a layout of one of various patterns, e.g., an active region pattern, a field region pattern, a pattern of a gate electrode of a transistor, a pattern of an upper electrode of a decoupling capacitor, a resistor pattern, a contact plug pattern, a hard mask, etc. In addition, each of the tiles Txy may have a layout of one of FIN-type patterns having cubic shapes, e.g., protruding or recessed shapes.

Next, referring to FIGS. 1B and 2B, the method may include fondling the test pattern block 10 on a wafer WF, i.e., operation S120, by performing any suitable process of semiconductor device processing. For example, the processes of processing a semiconductor device may include a photolithography process, an etching process, an etchback process, a chemical mechanical polishing (CMP) process, an epitaxial growth process, a deposition process, an ion injection process, and/or a silicidation process. Therefore, for example, the method of determining the effective tile array may include forming a plurality of chips 20 including the test pattern blocks 10 on the wafer WF by at least one of, e.g., a photolithography process, an etching process, an etchback process, a CMP process, an epitaxial growth process, a deposition process, an ion injection process, and/or a silicidation processes.

Next, referring to FIGS. 1B and 3A-3E, the method of determining the effective tile array may include measuring patterns in the test pattern block 10 of each chip 20 on the wafer WF, i.e., operation S130. FIGS. 3A through 3E illustrate diagrams of different potential patterns formed in the test pattern block 10 and corresponding measured dimensions.

Figure 3A:
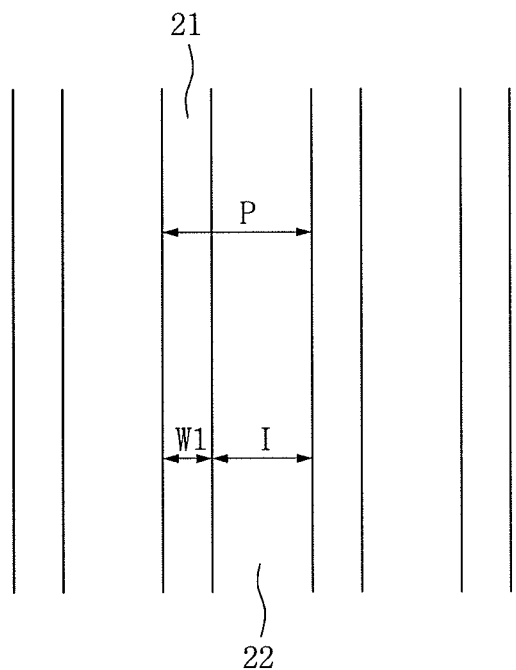
FIGS. 3A through 3E illustrate diagrams of processes of measuring different patterns included in a test pattern block formed on a wafer according to embodiments.

For example, referring to FIG. 3A, the test pattern block 10 on the wafer WF may include a plurality of linear patterns spaced apart from each other, e.g., when patterns 21 and 22 formed on the wafer WF include repetitive line-shaped patterns 21 and spaces 22 between the line-shaped patterns 21. In this case, measuring the patterns, i.e., operation S130 of FIG. 1B, may include measuring widths W1 and intervals I of the line-shaped patterns 21 and the spaces 22, respectively, and/or a pitch P including the width W1 and the interval I. The intervals I may correspond to widths of the spaces 22.

Figure 3B:
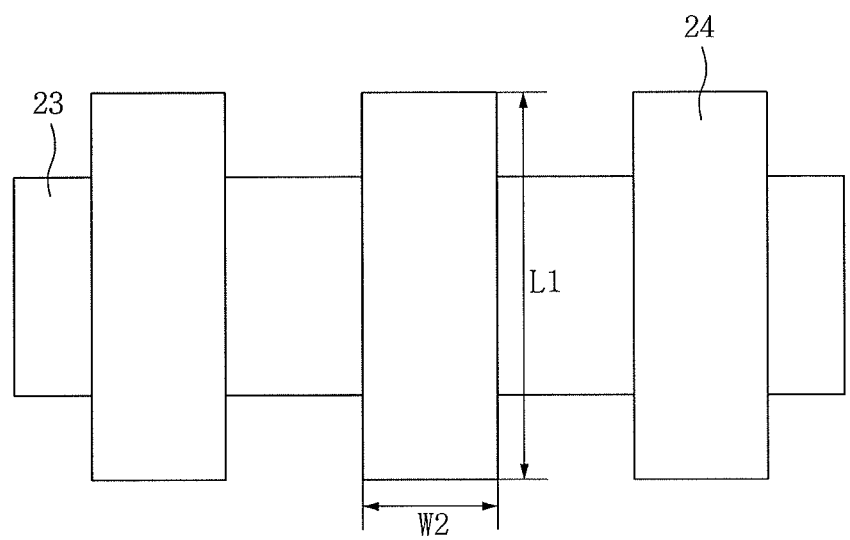

In another example, referring to FIG. 3B, the test pattern block 10 on the wafer WF may include a plurality of quadrangular-type patterns. For example, when patterns 23 formed on the wafer WF are box-type patterns or square-type patterns, the method may include measuring an area A of the patterns 23. When patterns 24 included in the test pattern block 10 are bar-type patterns 24, the method may include measuring a width W2 and length L1 of the bar-type patterns 24.

Figure 3C:
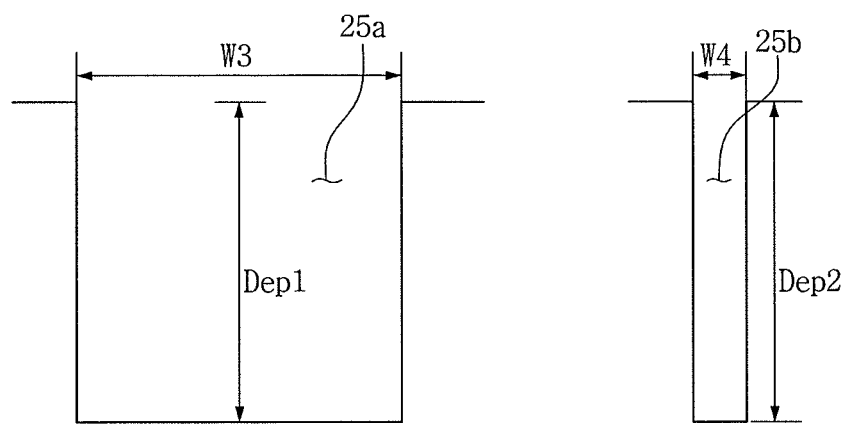

In another example, referring to FIG. 3C, the test pattern block 10 on the wafer WF may include trenches or holes through a substrate. For example, when patterns 25a and 25b formed on the wafer WF are trench-type patterns 25a or hole-type patterns 25b, the method may include measuring widths W3 and W4 and/or depths Dep 1 and Dept of trenches or holes.

Figure 3D:
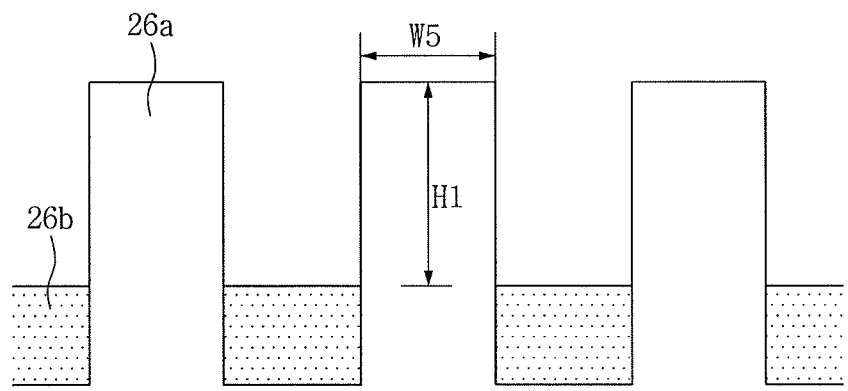

In another example, referring to FIG. 3D, the test pattern block 10 on the wafer WF may include a plurality of protrusions extending above a substrate. For example, when patterns 26a formed on the wafer WF are tower-type or rail-type patterns processed and formed using, e.g., an epitaxial growth process, a CMP process, or an etchback process, the method may include measuring a width W5 and/or height H1 of the protrusions of the patterns 26a. Another material layer 26b illustrated in a lower portion of FIG. 3D may include a growth mask layer or an etch mask layer.

Figure 3E:
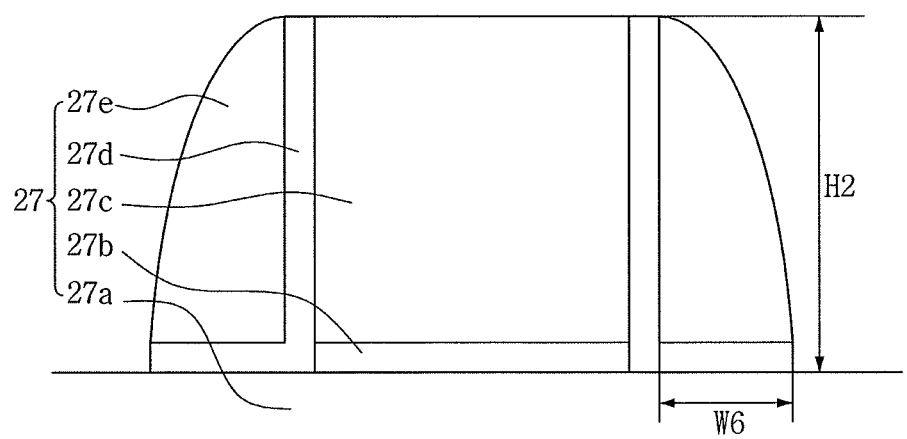

In another example, referring to FIG. 3E, the test pattern block 10 on the wafer WF may include a gate structure. For example, patterns 27 formed on the wafer WF may include gate structures, each gate structure including a gate insulating layer 27b, a gate electrode 27c, an inner spacer 27d, and an outer spacer 27e formed on a substrate 27a. In this case, the method may include measuring a width W6 or height H2 of the outer spacer 27e. The substrate 27a may include, e.g., silicon or silicon oxide. The gate insulating layer 27b may include, e.g., silicon oxide or a metal oxide. The gate electrode 27c may include, e.g., a metal. The inner spacer 27d may include, e.g., silicon oxide. The outer spacer 27e may include, e.g., silicon nitride.

Once measuring the patterns, i.e., operation S130, is complete, the measurement results are analyzed, i.e., operation S140 in FIG. 1B. For example, the method may include analyzing various measurements of the patterns 21 to 27 by graphically representing the measurements of the patterns 21 to 27, followed by determining an effective tile array (S150), as will be described in detail with reference to FIG. 4.

Figure 4:
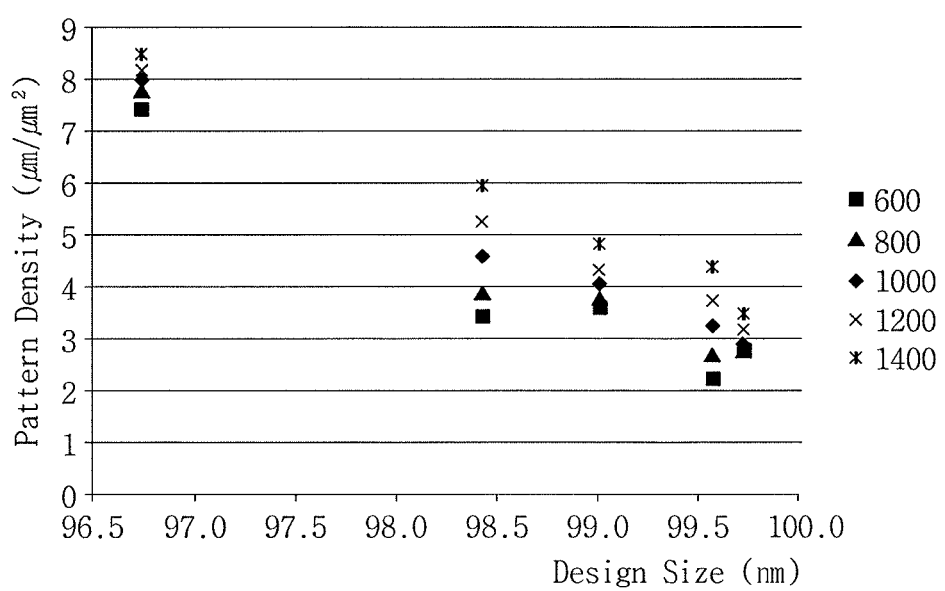
FIG. 4 illustrates a graph of the measuring results of the process of FIG. 3E.

FIG. 4 illustrates a graph obtained by plotting measurements of patterns 27 formed on the wafer WF according to embodiments. In particular, FIG. 4 is a graph obtained by plotting the width W6 of the outer spacer 27e shown in FIG. 3E, from among the various measurements of the patterns 21 to 27 of the test pattern block 10 formed on the wafer WF. In FIG. 4, the abscissa denotes design sizes of patterns in nm, the ordinate denotes perimeter densities of the patterns in $\mu m/\mu m^2$, and the different marks in the legend on the right side of the graph denote different tile areas in $\mu m^2$. When other patterns 21 to 27 are analyzed, i.e., other than outer spacers 27e, the ordinate may denote the density or occupation ratio (%) of the patterns per unit area. Tiles Txy having the same area Sy may be denoted by the same mark.

In detail, analyzing the graph in FIG. 4 may include selecting an area Sy of tiles Txy having a relatively linear variation and relationship from among marks plotted for respective areas Sy of the tiles Txy. For example, in the analysis of the graph of FIG. 4, when a Txy has an area Sy of about 1200 μm², i.e., marks denoted by "x" on the graph in FIG. 4, plotted marks tend to be the most linear relative to marks corresponding to other area sizes. More specifically, it can be seen that outer spacers 27e having a width W6 of about 96.5 nm to about 100 nm have the lowest dispersion when the pattern density or perimeter density Dx of the tiles Txy ranges from about 20% to about 80% and the tiles Txy have an area Sy of about 1200 μm².

As a result, the above experimental example may conclude that the most effective tile array is about 1200 μm² in a specific process, i.e., operation S150 in FIG. 1B. Accordingly, when the analysis result of operation S140 is applied, a tile having an area of about 1200 μm² may be determined as a unit tile, i.e., an effective tile array, in operation S150.

Next, i.e., in operation S200 of FIG. 1A, the predetermined range of the pattern density of the unit tile is established, e.g., falls within a predetermined range of about 20% to about 80% in FIG. 4. Finally, a pattern of a semiconductor device may be designed and modified in accordance with the established pattern density or perimeter density of the unit tile, i.e., operation S300 of FIG. 1A, as will be described in more detail below with reference to FIGS. 5A-5F. In this case, patterns may be formed to have the lowest dispersion in a specific process.

FIGS. 5A through 5F illustrate diagrams of various methods of modifying layouts of real patterns according to embodiments. Referring to FIGS. 5A through 5F, the method may include modifying a layout of real patterns so that a pattern density of the determined effective tile array is between the minimum allowed density and the maximum allowed density. For example, the method may include adding a dummy pattern or modifying a shape of a real pattern.

Figure 5A:
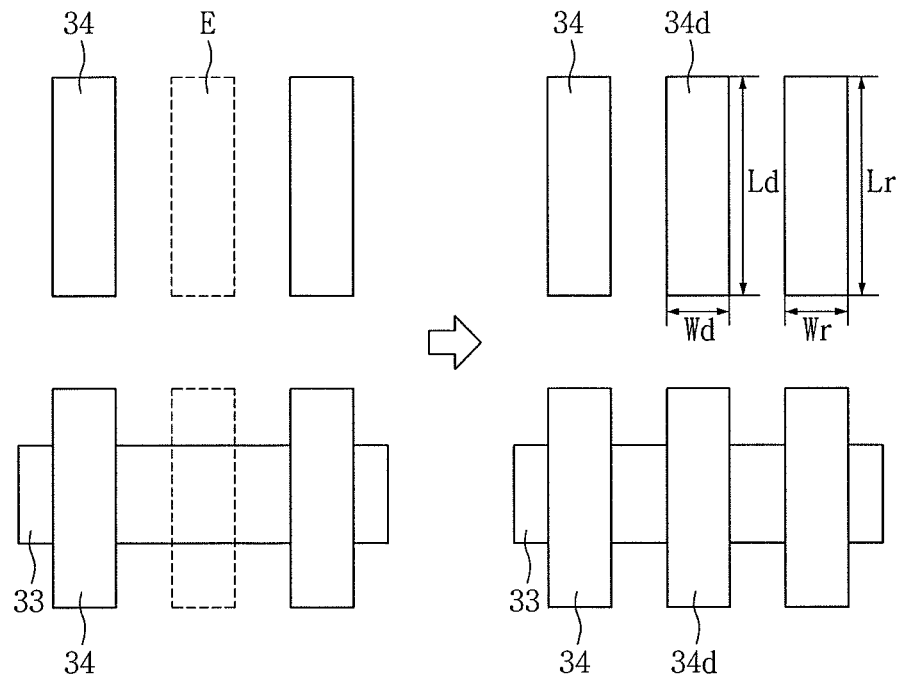
FIGS. 5A through 5F illustrate diagrams of various methods of modifying layouts of real patterns according to embodiments.

For example, referring to FIG. 5A, the method may include adding a dummy pattern 34d in an empty space E having no pattern or between two adjacent real patterns 34. For example, the dummy pattern 34d may have a transistor shape. More specifically, the dummy pattern 34d may have a shape and standard equal to or similar to a gate electrode pattern of a transistor or of an upper electrode pattern of a decoupling capacitor on a layout. This may indicate that the dummy pattern 34d is formed on, e.g., directly on, a same layer as the real patterns 34, and has a length Ld and width Wd equal (or similar) to a length Lr and width Wr of the real patterns 34. Accordingly, the dummy pattern 34d may be formed on an active region 33.

Figure 5B:
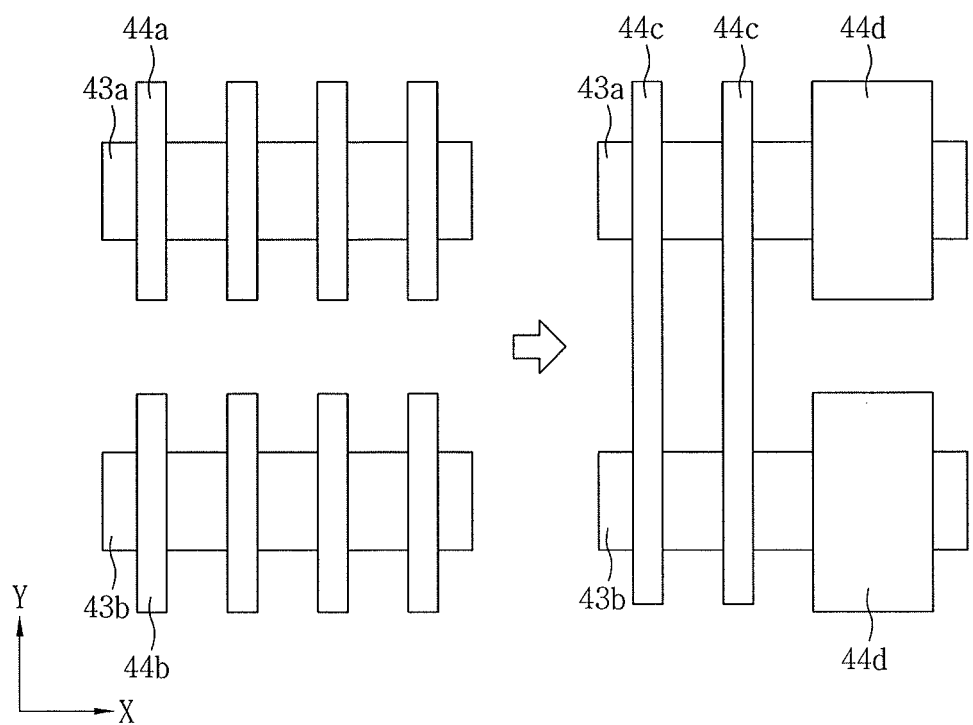
Figure 5C:
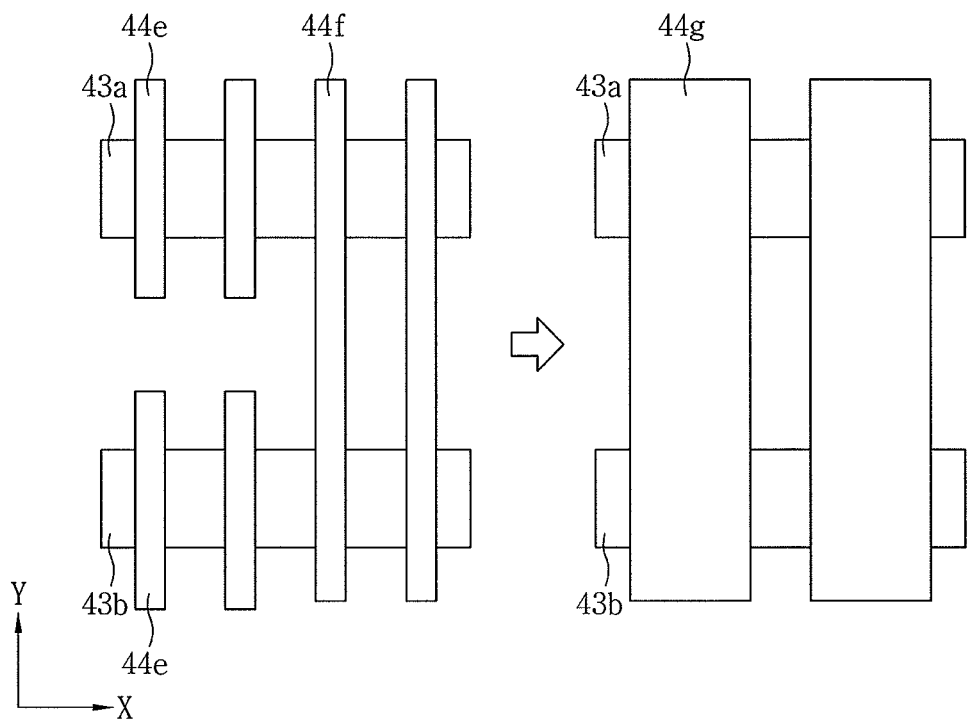

In another example, referring to FIG. 5B, the method may include unifying real patterns 44a and 44b, which are respectively formed on a first active region 43a and a second active region 43b, in a lengthwise or widthwise direction to modify the real patterns 44a and 44b into unified patterns 44c and 44d. For example, as illustrated in FIG. 5B, the separate most left patterns 44a and 44b on the left of the figure may be unified, e.g., combined, into a single continuous pattern 44c on the right of the figure. Similarly, as illustrated in FIG. 5B, two separate most right patterns 44a on the active region 43a on the left of the figure may be unified, e.g., combined, into a single wide pattern 44d on the right of the figure In another example, referring to FIG. 5C, the method may include unifying real patterns 44e and 44f formed on one or two active regions 43a and 43b in the lengthwise or widthwise direction to modify the real patterns 44e and 44f into unified patterns 44g. For example, as illustrated in FIG. 5C, four separate patterns 44e on both active regions 43a and 43b on the left of the figure may be unified, e.g., combined, into a single pattern 44g on the right of the figure.

Figure 5D:
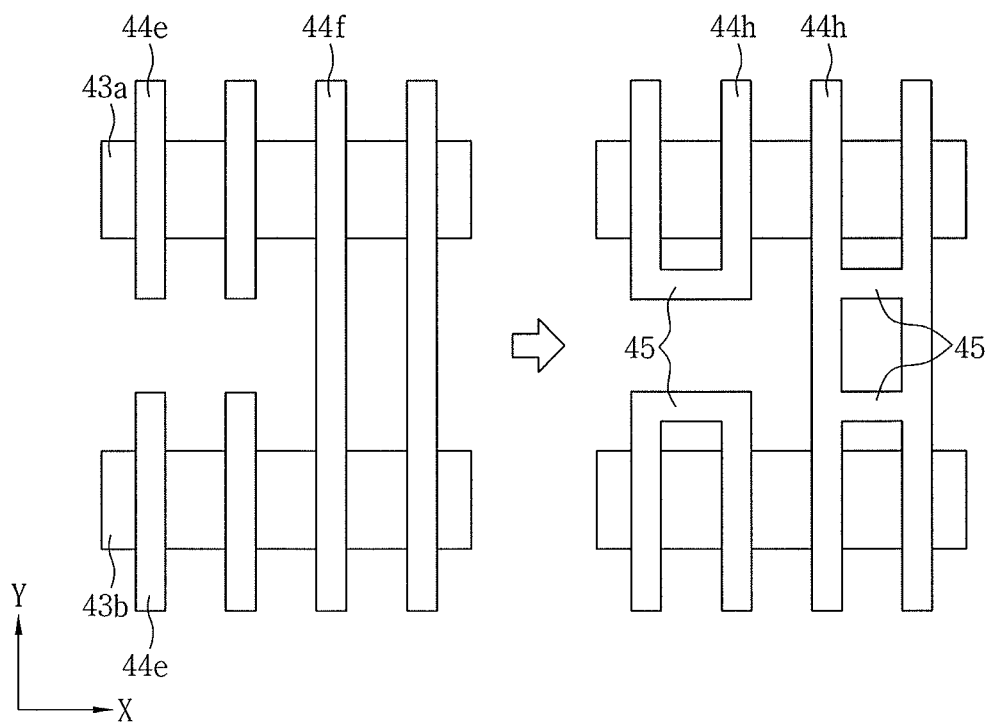

In another example, referring to FIG. 5D, the method may include connecting the real patterns 44e and 44f formed on one or two active regions 43a and 43b using bridges 45 to modify the real patterns 44e and 44f into unified patterns 44h. For example, as illustrated in FIG. 5D, two separate patterns 44e on the active region 43a on the left of the figure may be unified, e.g., combined, via the bridge 45 into a single U-shaped pattern 44h on the right of the figure.

Figure 5E:
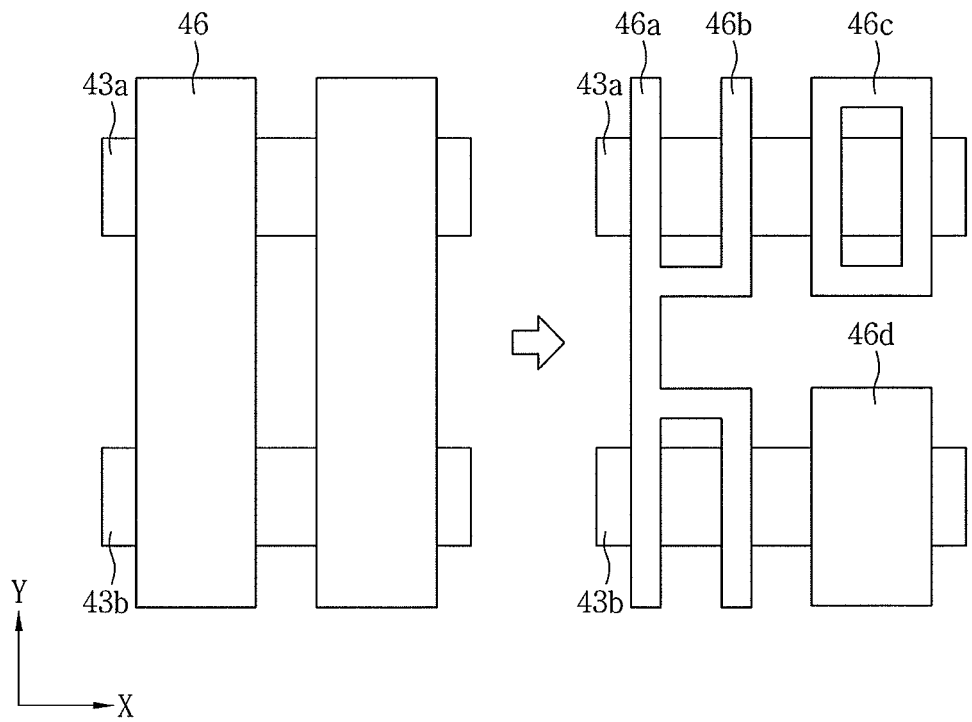

In another example, referring to FIG. 5E, the method may include modifying real patterns 46 into line-type patterns 46a, bar-type patterns 46b, rim-type patterns 46c, or small-box-type patterns 46d when it is necessary to increase the perimeter of the real patterns 46. For example, as illustrated in FIG. 5E, the size and shape of the pattern 46 on the left of the figure may be changed into line-type and bar-type patterns 46a and 46b on the right of the figure.

Figure 5F:
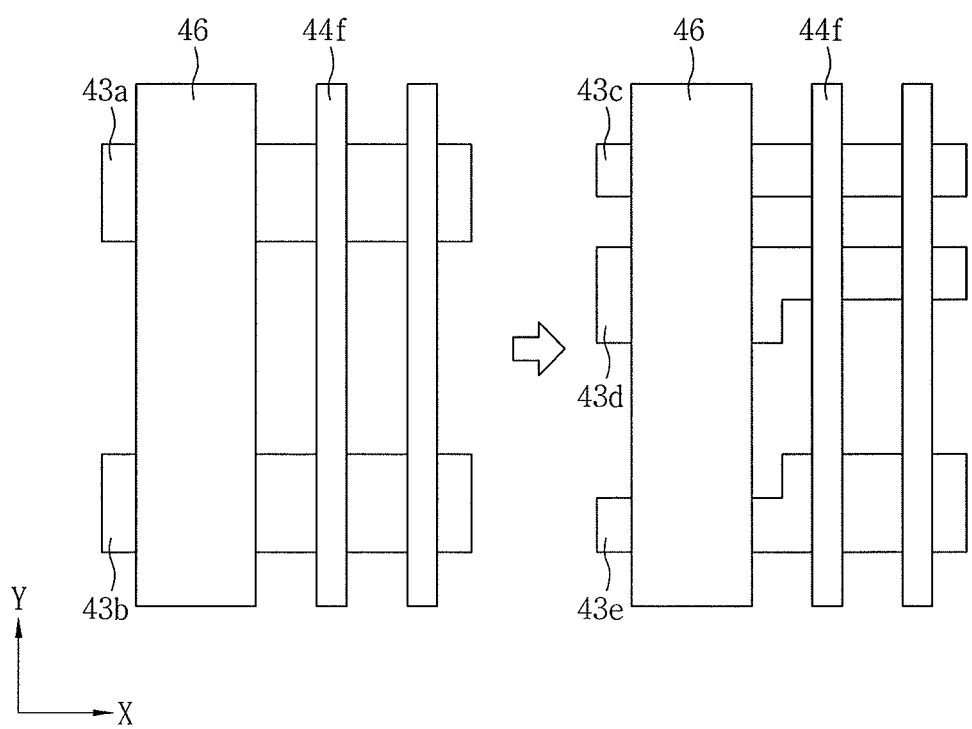

In another example, referring to FIG. 5F, the method may include modifying shapes of the active regions 43a and 43b. For example, the method may include wholly reducing the widths of the active regions 43a and 43b or partially increasing or reducing the widths of the active regions 43a and 43b to form modified active regions 43c, 44d, and 44e.

In FIGS. 5B through 5E, each of the modified unified patterns 44c to 44d, 44g to 44h, 45, and 46a to 46d may include a dummy pattern equal to a gate electrode pattern of a transistor or an upper electrode pattern of a decoupling capacitor, e.g., modifying a layout of an upper electrode pattern of a decoupling capacitor that is insensitive to electrical performance of semiconductor devices to adjust the pattern density may be more efficient than attempting to insert a dummy pattern into a minute empty space. Since real patterns corresponding to gate electrode patterns of transistors are standardized and may affect operations and performance of a semiconductor device, the real patterns may not be modified.

Figure 6A:
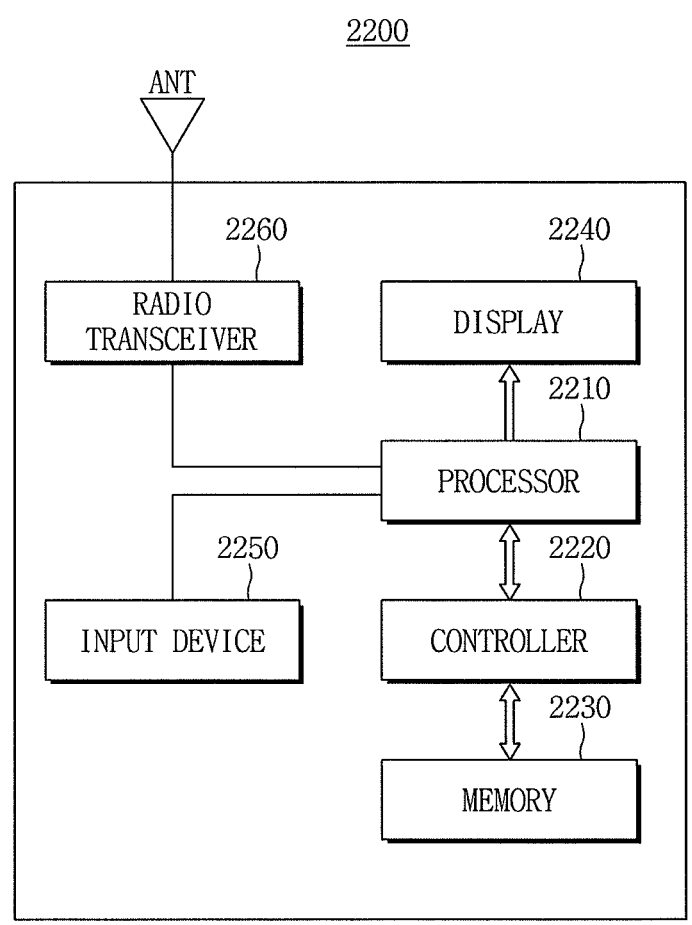
FIGS. 6A through 6C illustrate schematic block diagrams of electronic systems including semiconductor devices fabricated according to embodiments.
Figure 6B:
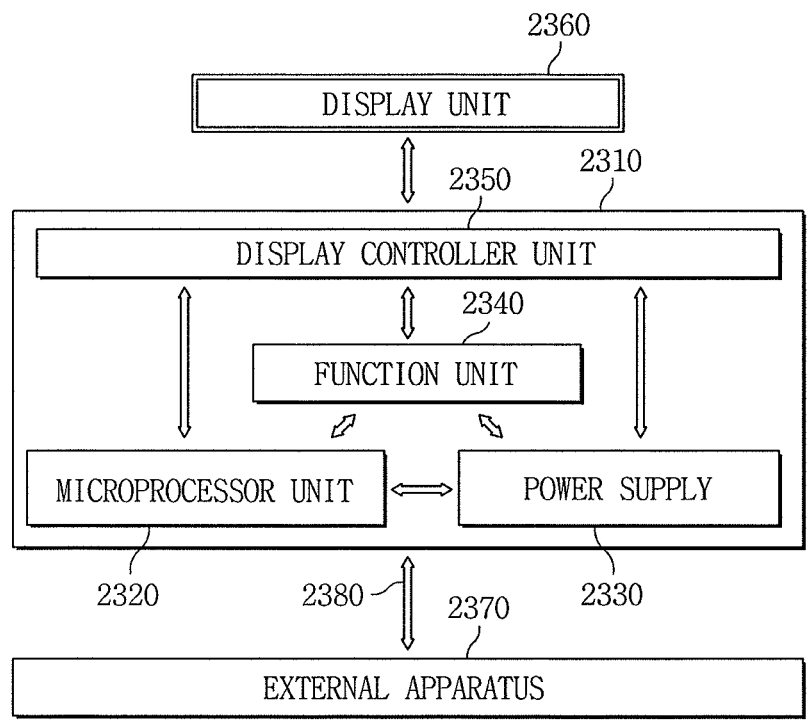
Figure 6C:
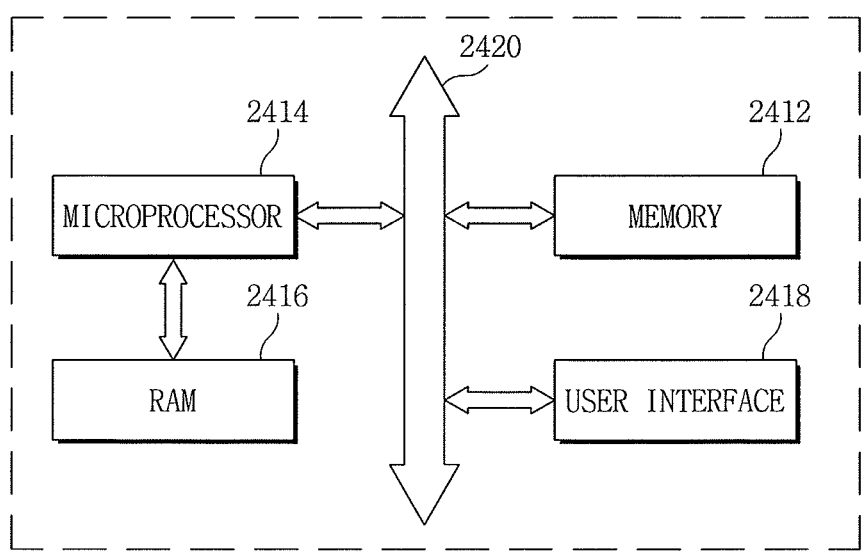

FIGS. 6A through 6C illustrate schematic block diagrams of electronic systems 2200, 2300, and 2400 including semiconductor devices fabricated according to embodiments.

Referring to FIG. 6A, the electronic system 2200 according to embodiments may include, e.g., a cellular phone, a smartphone, or a tablet personal computer (PC). The electronic system 2200 may include a processor 2210, a controller 2220, a memory 2230, a display 2240, an input device 2250, and a radio transceiver 2260.

The processor 2210 may include a semiconductor device fabricated according to embodiments. The processor 2210 may transmit and receive signals to and from the controller 2220. The controller 2220 may transmit and receive data to and from the memory 2230. For example, the processor 2210 may transmit and receive data to and from the memory 2230 through the controller 2220. The memory 2230 may include a dynamic random access memory (DRAM) or a flash memory. The processor 2210 may transmit electric signals to the display 2240. The display 2240 may receive the electric signals from the processor 2210 and generate visual images. The processor 2210 may receive command signals from the input device 2250. The input device 2250 may include a pointing device, e.g., a touch pad and a computer mouse, a keypad, or a keyboard. The processor 2210 may communicate with the radio transceiver 2260 and transmit or receive data. The radio transceiver 2260 may convert radio signals received through an antenna ANT into electric signals and transmit the electric signals to the processor 2210, or convert electric signals received from the processor 2210 into radio signals and externally transmit the radio signals.

Referring to FIG. 6B, the electronic system 2300 according to embodiments of the inventive concept may include a body 2310, a display unit 2360, and an external apparatus 2370. The body 2310 may include a microprocessor (MP) unit 2320, a power supply 2330, a function unit 2340, and/or a display controller unit 2350.

The body 2310 may include a system board or a mother board having a printed circuit board (PCB) and/or a case. The MP unit 2320, the power supply 2330, the function unit 2340, and the display controller unit 2350 may be mounted on a top surface of the body 2310 or may be disposed inside the body 2310. The display unit 2360 may be disposed on the top surface of the body 2310 or inside/outside the body 2310.

The display unit 2360 may display an image processed by the display controller unit 2350. For example, the display unit 2360 may include a liquid crystal display (LCD), an active-matrix organic light emitting diode (AMOLED), or various display panels. The display unit 2360 may include a touch screen. Accordingly, the display unit 2360 may have an input/output (I/O) function. The power supply 2330 may supply currents or voltages to the MP unit 2320, the function unit 2340, and the display controller unit 2350. The power supply 2330 may include a charging battery, a dry cell socket, or a voltage-to-current converter. The MP unit 2320 may receive a voltage from the power supply 2330 and may control the function unit 2340 and the display unit 2360. For instance, the MP unit 2320 may include a central processing unit (CPU) or an application processor (AP). The function unit 2340 may implement various functions of the electronic system 2300. For example, the function unit 2340 may include a touch pad, a touch screen, a volatile/nonvolatile memory, a memory card controller, a camera, a light, a voice/moving image reproduction processor, a wireless transceiving antenna, a speaker, a mike, a universal serial bus (USB) port, or units having various other functions. The MP unit 2320 or the function unit 2340 may include a semiconductor device fabricated according to embodiments.

Referring to FIG. 6C, the electronic system 2400 according to embodiments may include an MP 2414, a memory system 2412, and a user interface 2418, which may communicate data using a bus 2420. The MP 2414 may include a CPU or an AP. The electronic system 2400 may further include a random access memory (RAM) 2416 configured to directly communicate with the MP 2414. The MP 2414 and/or the RAM 2416 may be assembled within a single package. The user interface 2418 may be used to input information to the electronic system 2400 or output information from the electronic system 2400. For instance, the user interface 2418 may include a touch pad, a touch screen, a keyboard, a mouse, a scanner, a voice detector, a cathode-ray-tube (CRT) monitor, an LCD, an AMOLED, a plasma display panel (PDP), a printer, a light, or various other I/O devices. The memory system 2412 may store codes for operating the MP 2414, data processed by the MP 2414, or external input data. The memory system 2412 may include a memory controller, a hard disk, or a solid-state drive (SSD). The MP 2414, the RAM 2416, and/or the memory system 2412 may include a semiconductor device fabricated according to embodiments.

A semiconductor device according to various embodiments can be controlled based on an effective tile array and have a uniform pattern density. That is, embodiments provide an effective, i.e., reference, tile array by which a pattern density or perimeter density is modified to fall within a predetermined range according to characteristics of each of processes of processing various semiconductor devices. For example, embodiments provide determining an area, e.g., which is particularly sensitive to and closely related with each semiconductor process, and modifying a shape of patterns in that area in accordance with the effective tile to have the pattern density of the area fall within a predetermined range. Furthermore, embodiments propose various methods of controlling the pattern density or perimeter density. Accordingly, uniform specifications with low dispersions can be obtained in a specific process of processing a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of designing patterns of semiconductor devices, the method comprising:
    forming a plurality of tiles on a wafer, each tile of the plurality of tiles including a plurality of patterns of varying sizes to define tiles with varying pattern density;
    measuring the patterns in each of the plurality of tiles to obtain measurement results;
    analyzing the measurement results with respect to tile sizes and pattern density to determine a size of a tile exhibiting a linear variation of the measurement results according to the tile pattern density; and
    modifying, by using a computer, the pattern density of the determined tile,
    wherein analyzing the measurement results includes:
        setting a design size range of patterns on an X axis of a graph,
        setting a pattern density range on a Y axis of the graph, and
        plotting the measurement results on the graph for each size of the tiles to determine the size of tile exhibiting the most linear behavior on the graph.

2. The method as claimed in claim 1, wherein forming the plurality of tiles includes forming first tiles having a same area and second tiles having a same pattern density.

3. The method as claimed in claim 2, wherein forming the first tiles having the same area includes forming tiles having the same area and different pattern densities.

4. The method as claimed in claim 3, wherein forming the first tiles having the same area includes forming the tiles with the same area in a same column.

5. The method as claimed in claim 2, wherein forming the second tiles having the same pattern density includes forming tiles having the same pattern density and different areas.

6. The method as claimed in claim 5, wherein forming the second tiles having the same pattern density includes forming the tiles with the same pattern density in a same row.

7. The method as claimed in claim 2, wherein forming the plurality of tiles includes arranging the first and second tiles as islands in a plurality of rows and a plurality of columns.

8. The method as claimed in claim 1, wherein:
the patterns include an upper electrode pattern of a decoupling capacitor, and
modifying the pattern density includes modifying a layout of the upper electrode pattern of the decoupling capacitor.

9. The method as claimed in claim 8, wherein modifying the layout of the upper electrode pattern of the decoupling capacitor includes unifying at least two upper electrode patterns in an X-axis direction.

10. The method as claimed in claim 8, wherein modifying the layout of the upper electrode pattern of the decoupling capacitor includes unifying at least two upper electrode patterns in a Y-axis direction.

11. The method as claimed in claim 8, wherein modifying the layout of the upper electrode pattern of the decoupling capacitor includes connecting at least two upper electrode patterns using a bridge.

12. The method as claimed in claim 8, wherein modifying the layout of the upper electrode pattern of the decoupling capacitor includes modifying a box-type pattern into at least one of a line-type pattern, a bar-type pattern, or a rim-type pattern.

13. A method of designing patterns of semiconductor devices, the method comprising:
generating a test pattern block having an imaginary pattern layout by using a computer;
forming the imaginary pattern layout of the test pattern block in a real pattern, such that a real pattern layout mirroring the imaginary pattern layout is formed on a wafer;
measuring the real pattern layout and determining an effective tile array on the wafer that affects uniformity of the real pattern layout; and
modifying the layout of the real pattern such that a pattern density of the effective tile array falls within a reference density range,
wherein generating the test pattern block includes forming a plurality of tiles having at least one of different areas or different pattern densities,
wherein determining the effective tile array includes determining an area of a tile showing a relatively linear relationship between a size of the real pattern and the pattern density in the tile, and
wherein modifying the layout of the real pattern includes adding a dummy pattern to the layout of the real pattern to change an overall shape of the real pattern layout.

14. A method of designing patterns of semiconductor devices, the method comprising:
forming a plurality of tiles on a wafer, each tile of the plurality of tiles including a plurality of patterns of varying sizes to define tiles with varying pattern density, such that the patterns in each tile of the plurality of tiles are within predetermined ranges of size and density;
measuring dimensions of the patterns of each of the plurality of tiles to obtain measurement results;
analyzing the measurement results to determine a size of tile having patterns therein that most linearly vary a pattern density of a respective tile according to a predetermined measured pattern dimension; and
modifying, by using a computer, the pattern density of the determined tile,
wherein the patterns include an upper electrode pattern of a decoupling capacitor, and
wherein modifying the pattern density includes modifying a layout of the upper electrode pattern of the decoupling capacitor.

15. The method as claimed in claim 14, further comprising establishing a pattern density range of the determined tile, the pattern density range corresponding to the linear variation of the measured patterns.

16. The method as claimed in claim 15, wherein modifying the pattern density of the determined tile includes modifying the patterns, such that the modified pattern density is within the established pattern density.

17. The method as claimed in claim 14, wherein modifying the pattern density of the determined tile includes modifying a layout of the patterns.

* * * * *